United States Patent
Zhang et al.

(10) Patent No.: US 7,834,784 B1
(45) Date of Patent: Nov. 16, 2010

(54) DATA REDUNDANCY ELIMINATION MECHANISM INCLUDING FAST LOOKUP OF DATA PATTERNS EXHIBITING SPATIAL LOCALITY

(75) Inventors: Qiwen Zhang, San Jose, CA (US); Gideon Glass, Toronto (CA); Maxim Martynov, Los Gatos, CA (US)

(73) Assignee: Cisco Technology, Inc., San Jose, CA (US)

( * ) Notice: Subject to any disclaimer, the term of this patent is extended or adjusted under 35 U.S.C. 154(b) by 973 days.

(21) Appl. No.: 11/624,376

(22) Filed: Jan. 18, 2007

(51) Int. Cl.
*H03M 7/00* (2006.01)
(52) U.S. Cl. .............. 341/79; 341/51; 341/52; 341/78; 341/106; 341/107
(58) Field of Classification Search .............. 341/51, 341/52, 60, 78, 79, 106, 107
See application file for complete search history.

(56) References Cited

U.S. PATENT DOCUMENTS

| | | | |
|---|---|---|---|
| 4,464,650 A | 8/1984 | Eastman et al. | |
| 4,558,302 A | 12/1985 | Welch | |
| 5,995,716 A * | 11/1999 | Harrington et al. | 358/1.9 |
| 6,226,629 B1 * | 5/2001 | Cossock | 707/3 |
| 6,246,347 B1 * | 6/2001 | Bakhmutsky | 341/67 |
| 6,574,657 B1 * | 6/2003 | Dickinson | 709/203 |
| 6,731,814 B2 * | 5/2004 | Zeck et al. | 382/239 |
| 6,944,333 B2 * | 9/2005 | Douglass | 382/166 |
| 7,054,912 B2 * | 5/2006 | Kanai et al. | 709/213 |
| 7,061,885 B2 * | 6/2006 | Kurtz | 370/329 |
| 7,129,863 B1 * | 10/2006 | Mukhtar et al. | 341/79 |
| 7,436,330 B2 * | 10/2008 | Paris | 341/51 |
| 7,636,767 B2 * | 12/2009 | Lev-Ran et al. | 709/218 |
| 7,747,581 B1 * | 6/2010 | Li et al. | 707/686 |
| 2006/0047855 A1 * | 3/2006 | Gurevich et al. | 709/247 |

\* cited by examiner

*Primary Examiner*—Linh V Nguyen
(74) *Attorney, Agent, or Firm*—Baker Botts L.L.P.

(57) ABSTRACT

A data redundancy elimination system. In particular implementations, a method includes accessing a data block; dividing the data block into a plurality of data chunks; computing chunk signatures for the plurality of data chunks; identifying a plurality of anchor chunks in the plurality of data chunks; accessing a second memory to identify one or more matching chunk signatures; reading one or more signature blocks corresponding to the matching chunk signatures from a first memory into the signature block search space of the second memory; and matching one or more computed chunk signatures to chunk signatures of the one or more signature blocks in the signature block search space.

30 Claims, 6 Drawing Sheets

DATA REDUNDANCY ELIMINATION MECHANISM INCLUDING FAST LOOKUP OF DATA PATTERNS EXHIBITING SPATIAL LOCALITY

FIELD OF THE INVENTION

This disclosure relates generally to data compression systems.

BACKGROUND OF THE INVENTION

Network traffic often contains a significant amount of redundant data. To improve data transmission over a network, data is often compressed using data redundancy elimination (DRE) schemes. Before transmitting data, a DRE node typically divides data blocks into chunks, performs a lookup in its storage to identify chunk signatures that correspond to the chunks, and replaces redundant chunks with chunk signatures. Compression is achieved by sending chunk signatures instead of larger chunks of raw data over the network. When a DRE node receives a chunk signature sent by another DRE node, the recipient DRE node performs a lookup in its storage in order to restore original data corresponding to a given chunk signature. Since redundancy detection is done on a chunk by chunk basis, if there is a one-byte difference between two chunks, redundancy will not be detected. Accordingly, with smaller chunk sizes, more redundancies that can be detected and higher compression ratios can be achieved. However, small chunk sizes also mean that the DRE system needs to store a large number of chunks and to index a large number of chunk signatures for lookup. In some DRE systems, the amount of stored data could be as large as 500 GB, which can slow down network throughput, as lookup operations can be slow. Therefore, a DRE system faces a tradeoff. A large data storage is desirable in order to index a large number of data chunks and chunk signatures. However, with large data storage, the DRE system should somehow facilitate a fast lookup in order to detect redundancies to ensure that throughput is not unduly affected. Even with a large cache of data patterns in dynamic random access memory, not all of the data chunks and chunk signatures will fit into the cache.

DESCRIPTION OF EXEMPLARY EMBODIMENTS

A. Overview

Particular embodiments of the present invention utilize data sampling, a tiered lookup mechanism, and spatial locality to perform fast, scalable redundancy detection and elimination in a data compression device. In a particular implementation, a compression module maintains contiguous sequences of received data chunks in data units, and corresponding chunk signatures in signature blocks. According to one implementation, a compression module performs lookup operations in a RAM storing a selected subset of chunk signatures. To limit the number of chunk signatures in the lockup, the compression module selects data chunks, or "anchor chunks," based on their unique qualities, such as having a lower occurrence probability. These anchor chunks map to signature blocks which, when detected in a block of data, are loaded into a signature block search space to facilitate fast lookup operations. As discussed in more detail below, particular implementations of the invention facilitate fast lookup operations by limiting the search space for a given data block to the signature blocks that correspond to anchor chunks identified in the data block. Particular implementations of the invention take advantage of the spatial locality of chunks that neighbor the anchor chunks, and the occurrence probabilities of the anchor chunks to read a subset of chunk signatures into a fast-access memory space (such as RAM) that are likely to contain matching chunk signatures. By limiting the search space, data throughput is improved.

B. Example Network System Architecture

B.1. Network Topology

Figure 1:
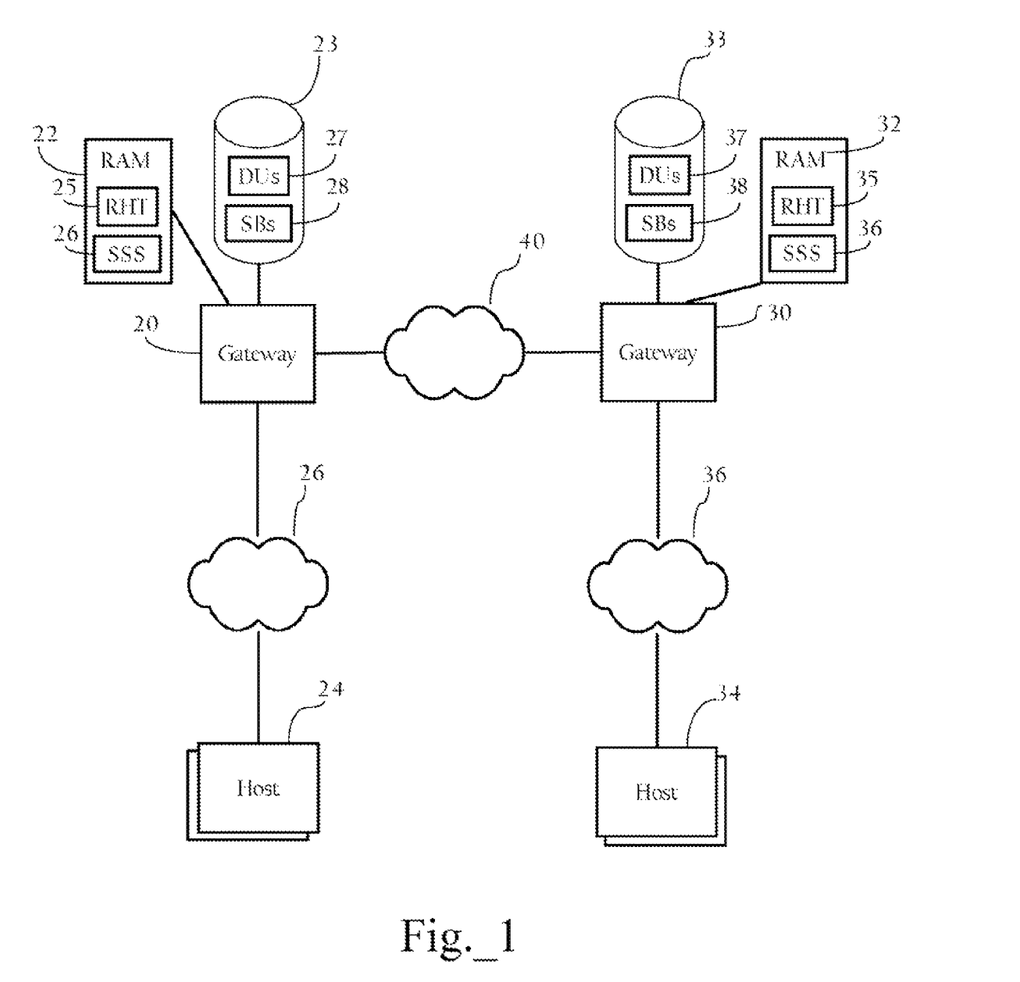
FIG. 1 illustrates an example network environment in which particular implementations of the invention may operate.

FIG. 1 illustrates an example network environment in which particular implementations of the invention may operate. In a particular implementation, the compression functions described herein can be implemented by a network device, such as gateway 20, disposed in a communications path between hosts 24, 34. In one implementation, gateway 20 works in connection with a second gateway 30. In one implementation, gateway 20 compresses data, tunnels the compressed data to gateway 30, which decompresses the data and forwards the data to one or more destination hosts. In one implementation, the gateway 20 includes, or is operatively coupled to, a random access memory (RAM) 22, and a mass storage device, such as a hard drive 23. Similarly, gateway 30 includes, or is coupled to, a RAM 32, and a hard drive 33.

As described in more detail below, the RAM 22 includes a RAM hash table 25 and a signature search space 26, and the hard drive 23 includes data units 27 and signature blocks 28. Also, the RAM 32 includes a RAM hash table 35 and a signature search space 36, and the hard drive 33 includes data units 37 and signature blocks 38. The gateways 20 and 30 are coupled to networks 26, 36 and 40, and are disposed in the communications path between a plurality of hosts (e.g., hosts 24, 34). Hosts 24, 34 may be server systems, client systems or intermediate nodes.

As described in more detail below, the gateways 20 and 30, in one implementation, include a compression module operative to perform compression and decompression functionalities when transmitting and receiving data over the network 40. The compression and decompression functionalities of the compression module may be located at any appropriate location such as an end host 24 and 34, or at an intermediate device such as gateways 20 and 30. Furthermore, the gateways 20 and 30 may employ some form of encapsulation (such as General Routing Encapsulation (GRE), etc.) to tunnel compressed data streams to each other.

In one implementation, each of networks 26, 36, and 40, generally refer to a computer network, such as a LAN, a WAN, etc., that may include one or more intermediate network devices (e.g., routers, switches, etc.), which allow for the transmission of data and/or messages. FIG. 1 illustrates one possible data transmission environment in which the embodiments may operate; however, other implementations are possible.

B.2. Gateway

Figure 2:
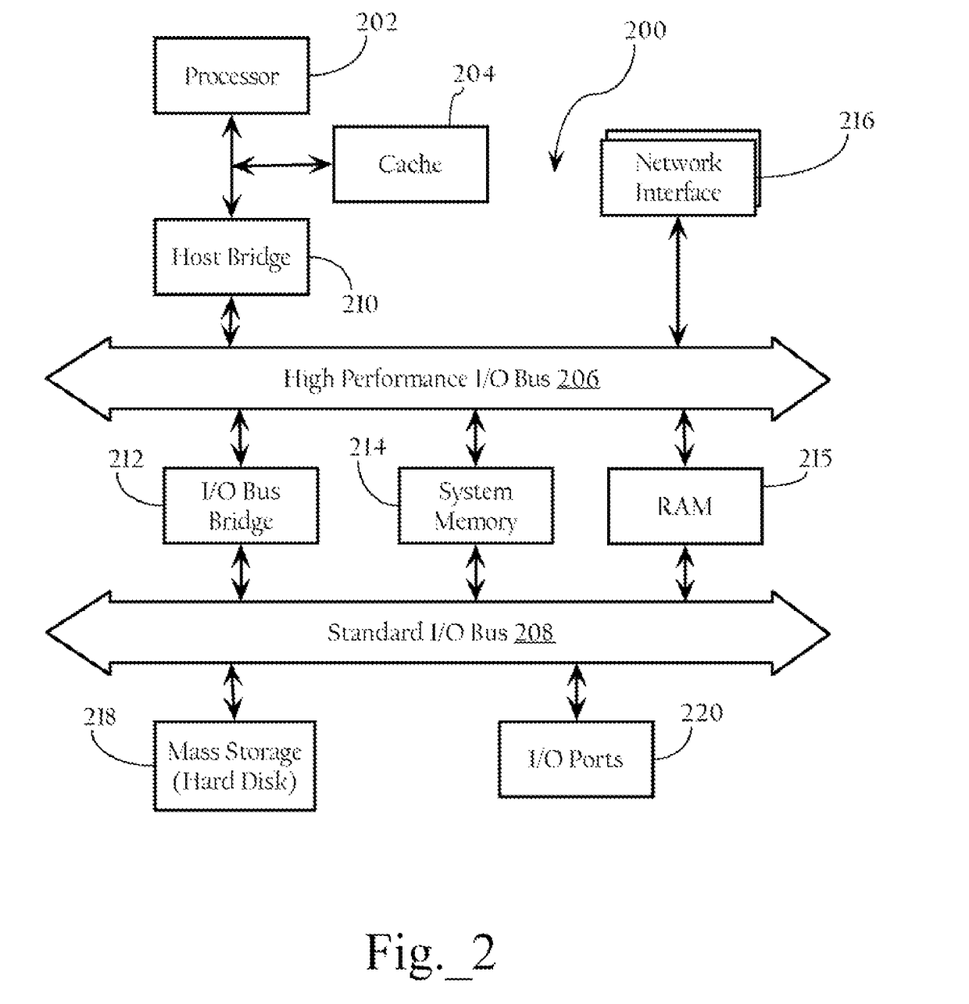
FIG. 2 illustrates an example hardware system, which may be used to implement a gateway.

FIG. 2 illustrates an example hardware system 200, which may be used to implement a gateway 20 or 30. In one implementation, hardware system 200 comprises a processor 202, a cache memory 204, and one or more software applications and drivers directed to the functions described herein. As described in more detail below, the gateway may include a compression module that utilizes a chunking algorithm to compress data blocks of a data stream. In one implementation, hardware system 200 includes a high performance input/output (I/O) bus 206 and a standard I/O bus 208. A host bridge 210 couples processor 202 to high performance I/O bus 206, whereas I/O bus bridge 212 couples the two buses 206 and 208 to each other. A system memory 214, and RAM 215 and one or more network/communication interfaces 216 couple to bus 206. Hardware system 200 may further include video memory (not shown) and a display device coupled to the video memory. Mass storage 218 (e.g., hard disk) and I/O ports 220 couple to bus 208. Hardware system 200 may optionally include a keyboard and pointing device (not shown) coupled to bus 208. Collectively, these elements are intended to represent a broad category of computer hardware systems, including but not limited to general purpose computer systems based on the Pentium® processor manufactured by Intel Corporation of Santa Clara, Calif., as well as any other suitable processor.

Network interface 216 provides communication between hardware system 200 and any of a wide range of networks, such as an Ethernet (e.g., IEEE 802.3) network, etc. Mass storage 218 provides permanent storage for the data and programming instructions to perform the above described functions implemented in the system controller, whereas system memory 214 (e.g., DRAM) provides temporary storage for the data and programming instructions when executed by processor 202. I/O ports 220 are one or more serial and/or parallel communication ports that provide communication between additional peripheral devices, which may be coupled to hardware system 200.

Hardware system 200 may include a variety of system architectures; and various components of hardware system 200 may be rearranged. For example, cache 204 may be on-chip with processor 202. Alternatively, cache 204 and processor 202 may be packed together as a "processor module," with processor 202 being referred to as the "processor core." Furthermore, certain implementations of the present invention may not require nor include all of the above components. For example, the peripheral devices shown coupled to standard I/O bus 208 may couple to high performance I/O bus 206. In addition, in some implementations only a single bus may exist, with the components of hardware system 200 being coupled to the single bus. Furthermore, hardware system 200 may include additional components, such as additional processors, storage devices, or memories.

As discussed above, in one embodiment, the operations of the gateway described herein are implemented as a series of software routines run by hardware system 200. These software routines comprise a plurality or series of instructions to be executed by a processor in a hardware system, such as processor 202. Initially, the series of instructions are stored on a storage device, such as mass storage 218. However, the series of instructions can be stored on any suitable storage medium, such as a diskette, CD-ROM, ROM, EEPROM, etc. Furthermore, the series of instructions need not be stored locally, and could be received from a remote storage device, such as a server on a network, via network/communication interface 216. The instructions are copied from the storage device, such as mass storage 218, into memory 214 and then accessed and executed by processor 202.

An operating system manages and controls the operation of hardware system 200, including the input and output of data to and from software applications (not shown). The operating system provides an interface between the software applications being executed on the system and the hardware components of the system. According to one embodiment of the present invention, the operating system is the Windows™ 95/98/NT/XP operating system, available from Microsoft Corporation of Redmond, Wash. However, the present invention may be used with other suitable operating systems, such as the Apple Macintosh Operating System, available from Apple Computer Inc. of Cupertino, Calif., UNIX operating systems, LINUX operating systems, and the like.

C. Basic Information Flow

Figure 3:
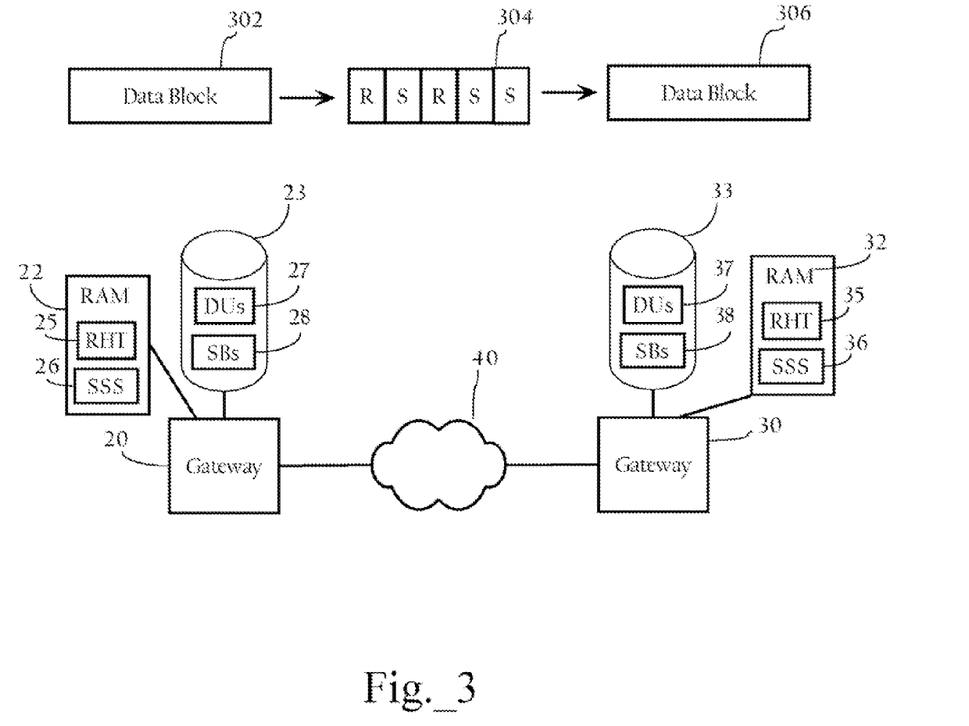
FIG. 3 illustrates an example flow of information between gateways.

FIG. 3 illustrates an example flow of information between gateways 20 and 30. In one implementation, gateway 20 receives a data stream from one or more hosts 24. For ease of illustration, only one data block 302 is shown to represent a portion of the data stream. Implementations of the present invention described herein may involve multiple contiguous data blocks. As described in more detail below, a compression module divides the data block 302 into data chunks, and computes chunk signatures. The compression module compresses the data by replacing raw data with the chunk signatures found during a lookup operation in a cache of data chunks and corresponding chunk signatures. This may increase throughput, since a single chunk signature may potentially replace a larger amount of raw data during transmission.

Gateway 20 then transmits the resulting compressed data block 304, which may include raw data chunks (labeled "R") and chunk signatures (labeled "S") across network 40 to gateway 30. In one implementation, a compression module at gateway 30 reconstructs the data stream by converting the chunk signatures into corresponding raw data. Gateway 30, in one implementation, decompresses the data stream by looking up the detected chunk signatures and replacing the chunk signatures with the corresponding raw data, which results in a data block 306 that matches data block 302. The following describes the compression process, according to one particular implementation, in more detail.

D. Example Data and Memory Structures

Figure 4:
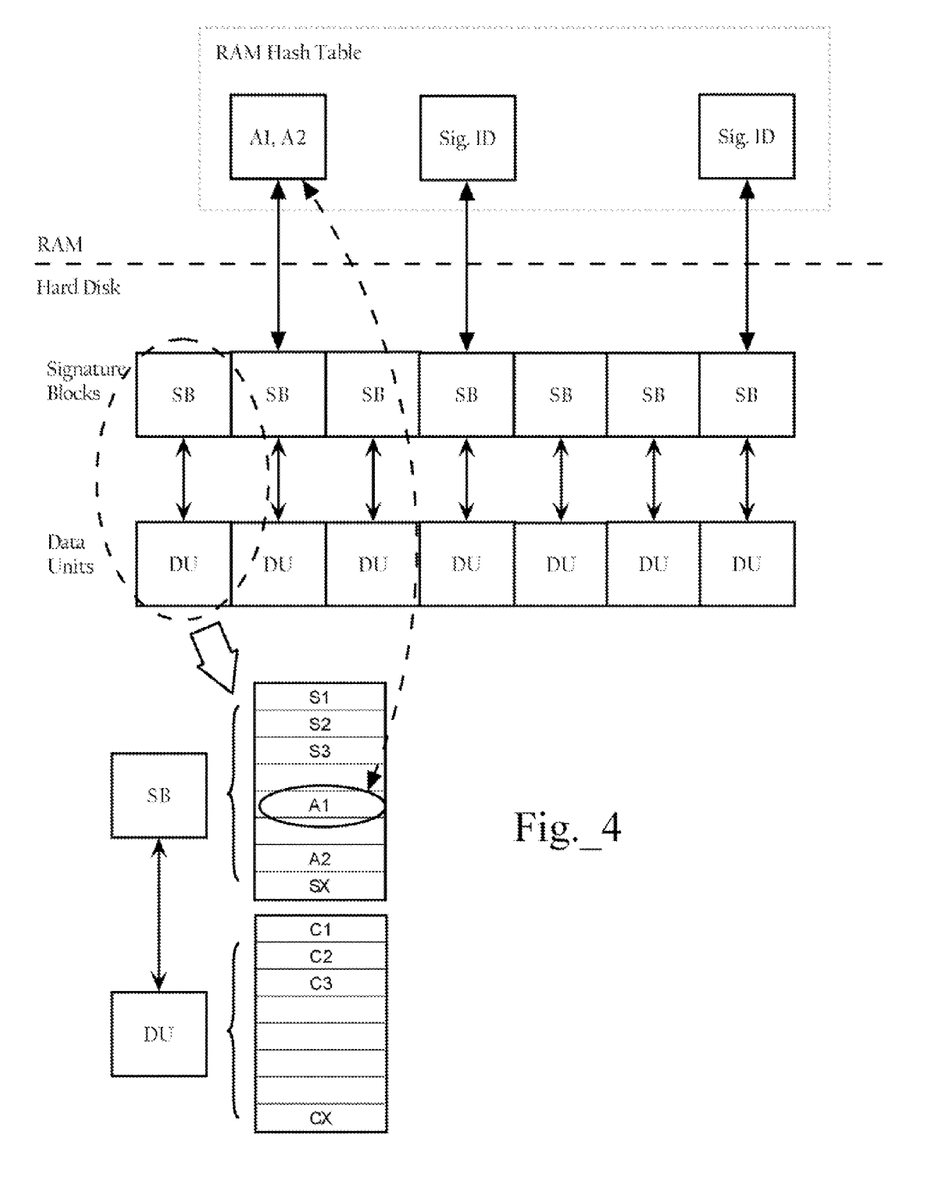
FIG. 4 illustrates an example block diagram of data structures organized in a mass storage device, such as a hard disk, and in a memory, such as dynamic random access memory, allowing for faster access.

FIG. 4 illustrates an example block diagram of data structures organized in a first memory (typically a mass storage device, such as a hard disk), and in second memory, (typically, a smaller memory device allowing for fast memory access, such as dynamic random access memory (RAM)). For purposes of description, the following refers to the first memory as a hard disk, and the second memory as RAM. One skilled in the art will recognize that other memory and data storage devices can be used. As FIG. 4 shows, in one implementation, the hard disk stores data units (labeled "DU") and signature blocks (labeled "SB"), while the RAM stores a RAM hash table.

In one implementation, a data unit is a data structure that stores a contiguous sequence of data chunks (C1, C2, etc.) received at a compression module. In one implementation, each data unit may have a fixed size and essentially contains a temporal history of the data chunks received at a given compression module. To construct a data unit, in one implementation, adjacent chunks read from a network buffer are stored in the same data unit, until the data unit is full. This preserves the original order of the data, which provides spatial locality advantages for future searches. As described in more detail below, during lookup operations, the compression module searches for a select number of data chunks, referred to as "anchor chunks." A set of anchor chunks is a representative sample or approximation of the full set of all data chunks. Anchor chunks are described in more detail below in connection with FIG. 5. If an anchor chunk is found in a data unit, the adjacent non-anchor chunks are likely to be in the same data unit.

In one implementation, a signature block is a data structure that stores chunk signatures (S1, S2, etc.), where each chunk signature identifies a corresponding data chunk. In one implementation, a chunk signature may be a checksum or hash of raw data of a given data chunk. In one implementation, each signature block corresponds to a data unit—in that there is a one-to-one correspondence between a signature block and a data unit. In one implementation, each signature block includes a hash table that indexes chunk signatures and the locations of corresponding data chunks in the data units. This indexing enables the compression module to perform quick lookup operations in a given signature block to determine if it contains a given chunk signature. Chunk signatures in a signature block have a one-to-one correspondence to chunks in an associated data-unit. Accordingly, locating a chunk signature in a signature block is equivalent to locating the corresponding data chunk.

In one implementation, a signature block may have a fixed size. Since a signature block stores only data signatures and locations, the size of a signature block may be smaller than the size of a data unit. Both data units and signature blocks may be directly stored on a hard disk and may be written to or read from the hard disk in a signature search space of RAM for fast lookup operations.

In one implementation, a RAM hash table is a data structure, stored in dynamic random access memory, that allows for fasting mapping between chunk signatures (e.g., A1, A2) and signature blocks. In one implementation, RAM hash table includes entries comprising mappings between anchor chunk signatures and corresponding signature blocks. Since RAM size is typically limited for economic reasons, only selected, not all, chunk signatures are added to the RAM hash table. For purposes of description, the selected chunks are called "anchor" chunks. Anchor chunk selection can be based on any suitable algorithm, as discussed below. In one implementation, the RAM hash table is stored in the RAM, since the RAM has a faster data rate than the hard drive. Accordingly, the lookup speed remains constant, regardless of the number of chunk signatures stored.

E. Example Operation

In one implementation, a compression module may implement a first process to populate the data structures discussed above, and a second process that utilizes the data structures to compress or de-compress a data stream. For example, as discussed above, a first process can accumulate data chunks in a data unit buffer or memory space. When the data unit buffer is full, the first process may store the data unit and a corresponding signature block in a mass storage device, and store anchor chunk entries, each comprising an anchor chunk signature and a signature block identifier or location in the RAM hash table. In one implementation, the first process may run completely independently of the compression or decompression process, performing its own chunking and signature algorithms. In another implementation, the first process can monitor, via hooks or other programming devices, operation of the decompression or compression process to receive chunks, chunk signatures and anchor chunk selections. In addition, data units and signature blocks are continuously written to the mass storage device as data streams traverse the compression module. In one implementation, only non-redundant data units and signature blocks are stored in the mass storage device. When the mass storage device is full, the oldest data units and corresponding signature blocks are overwritten. Embodiments described herein support fast lookup operations of a large volume of data while keeping sizes of data chunks small, thereby facilitating fine-grain redundancy detection.

Figure 5:
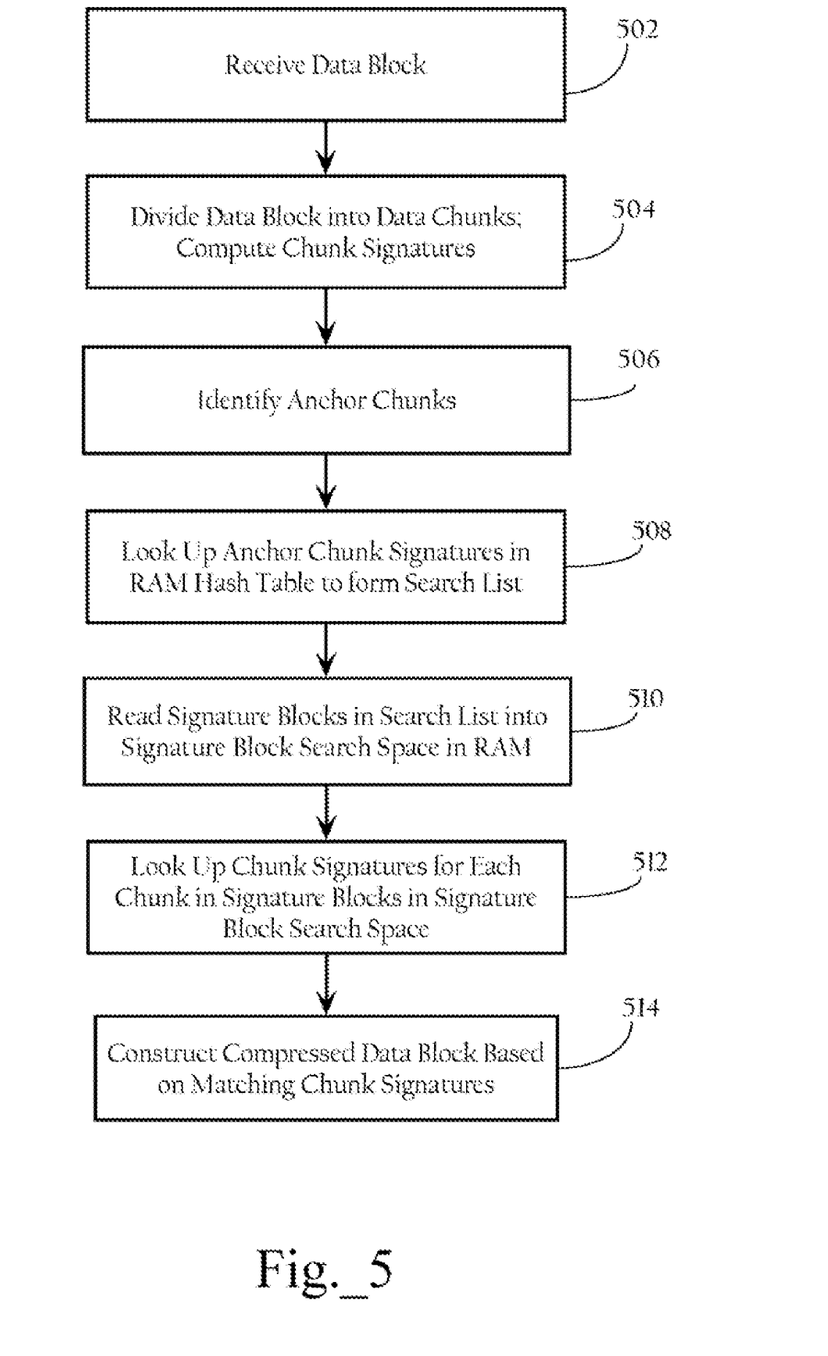
FIG. 5 illustrates an example method for looking up data chunks in a cache.

FIG. 5 illustrates an example method for looking up data chunks in a cache, and constructing a compressed data block. As FIG. 5 shows, the compression module of gateway 20, for example, receives a data block (502) of a continuous data stream. The compression module divides the data block into data chunks and computes chunk signatures for the data chunks (504). The compression module may apply any suitable chunking algorithm to divide the data block into data chunks. For example, in one implementation, the compression module may simply divide the data block into fix-size chunks. In other implementations, the compression module may apply a dynamic or pseudo-random chunking algorithm that yields variable-sized chunks.

The compression module then selects one or more anchor chunks in the data block (506). In one implementation, selection criteria for designating a given data chunk as an anchor chunk may be based on the content of the data chunk and an occurrence probability that a given chunk may occur in a stream of random data. For example, the compression module may compare one or more aspects of a checksum or hash value of a given data chunk to one or more threshold values indicative of the probability of occurrence. In one implementation, the compression module may calculate the hash value for a given data chunk and then assess the value a contiguous sequence of least significant bits. More specifically, the compression module may determine the number N of contiguous least significant bits of the checksum or hash value that are equal to 1, and then compare that number to a threshold value. In this instance, a probability value can be $\frac{1}{2}^N$, where N is the number of contiguous least significant bits all being equal to 1. For example, if N is 1, the probability of the last bit being 1 would be ½, or 50%. As the foregoing demonstrates, N is inversely proportional to the probability of occurrence. If the number N (e.g., 9) is greater than the threshold value (e.g., 8), the compression module may designate the data chunk as an anchor chunk. If the number N is less that the threshold value (e.g., 8), the compression module may not designate the data chunk as an anchor chunk. The number of desired anchors may be adjusted by adjusting the threshold probability value or N. For example, if the threshold occurrence probability value is increased (N is decreased), anchor chunks are selected more often in a given data stream. Conversely, if the threshold value is decreased (N is increased), fewer data chunks will be selected as anchor chunks in a given data stream.

In one implementation, selection of anchor chunks preferably results in a substantially uniform distribution such that selected anchor chunks have approximately an equal number of non-selected neighboring data chunks. This spatial locality is useful since only selected data chunks (i.e., anchor chunks) in the incoming data stream will be searched for in the RAM hash table. When selection results in a substantially uniform distribution, each data stream may be well represented in the RAM hash table. Thus, more matches are likely when the same data chunks are repeatedly sent. In one implementation, selection parameters may be adjusted according to the RAM size and hard disk space available. For example, if RAM size is limited but disk space is quite large, the compression module may select a small number of anchor chunks and thus add a small number of chunk signatures to the RAM hash table. This enables a limited RAM hash table to potentially index more data.

After the anchor chunks are identified, the compression module searches the RAM hash table to identify anchor chunk signatures in the RAM hash table that match the identified anchor chunk signatures of the data block (508). The compression module builds a search list including the signature blocks corresponding to the matching anchor chunk signatures in the RAM hash table. The compression module then reads the signature blocks identified in the search list into a signature search space 26 in random access memory (510). To compress the data block, the compression module then looks up all chunk signatures of the data block against the signature blocks of the search list (512), and constructs a compressed data block by replacing raw data chunks with matching chunk signatures, if any (514). If a given chunk signature is not found, the compression module does not compress the raw data chunk. The compression module may then pass the data block to a tunneling process that transmits the data block to a remote gateway, such as gateway 30, where it is decompressed.

Figure 6:
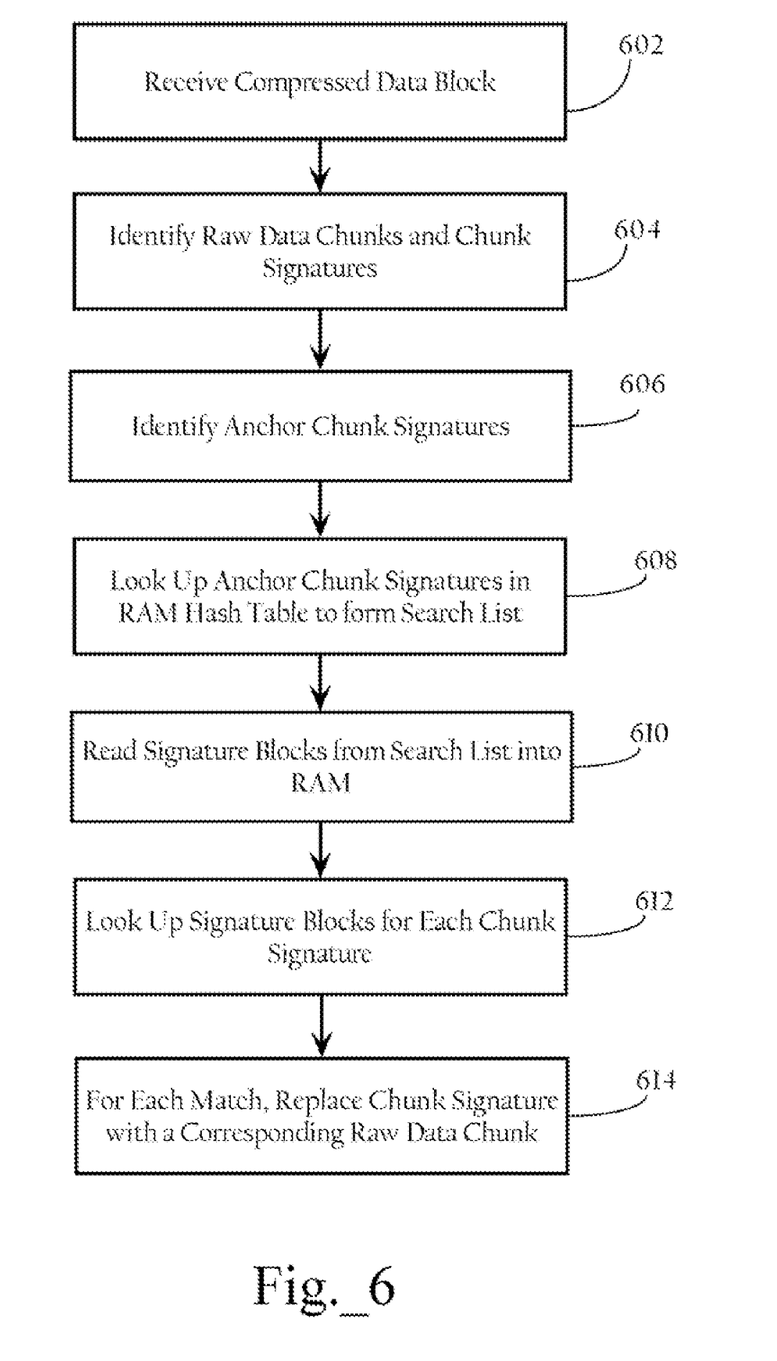
FIG. 6 illustrates another example method for looking up data chunks in a cache.

FIG. 6 illustrates another example method for using the data structures and look up operations discussed above in connection with decompressing a compressed data block received from a remote gateway. As FIG. 6 shows, the compression module of gateway 30, for example, may receive a compressed data block (602), where the data block may contain raw data chunks and/or chunk signatures. The compression module identifies the raw data chunks, computing chunk signatures for the raw data chunks, and identifies the chunk signatures in the compressed data block (604). The compression module then identifies one or more anchor chunk signatures in the data block (606). In one implementation, identification of anchor chunks can be based on the contents of the chunk signatures. The compression module, when decompressing data, will typically use the same anchor chunk identification algorithm as the node that compressed the data (see above). In another implementation, anchor chunk identification is based on the raw data of the chunk. In such an implementation, an extra bit (or other indicator) is appended to anchor chunk signatures. The anchor chunk indication can be used to identify anchor chunks and form the search list of signature blocks. In addition, the compression module may also analyze the raw data chunks in the received block to identify anchor chunks.

The compression module then looks up the anchor chunk signatures in the RAM hash table (608). If the compression module finds a given anchor chunk signature in the RAM hash table, it adds the signature block(s) corresponding to the anchor chunk to a search list. The compression module then reads the signature blocks corresponding to the anchor chunk signatures in the search list into the signature search space 36 of the dynamic random access memory (610). To decompress the received compressed data block, the compression module searches the signature blocks in the search list (and read into RAM) for chunk signatures (anchor and non-anchor) that match the chunk signatures in the compressed data block (612). For each match, the compression module replaces the chunk signature with a corresponding raw data chunk stored in a data unit (614).

The above-described lookup method is based on the following assumption about incoming data. For each repeated data chunk, there is a repeated anchor chunk that is close to it in proximity, both in the data stream and in the cache maintained by the compression module. In one implementation, the exact position of the repeated anchor chunk with respect to the repeated data chunk does not matter, and the location may be different in the cache and in the stream. The lookup operation is approximate and probabilistic, because in some scenarios, this assumption may fail and may result in a false negative, where a given data chunk is determined to not be in the cache when the data chunk is indeed in the cache. In one implementation, the probability of a false negative may depend on the selection parameters for the anchor chunks, among other parameters. The more anchor chunks that are selected (i.e., the higher their frequency), the lower the probability of a false negative. A certain number of false negatives can be tolerated in light of the throughput gains achievable by limiting searches of chunk signatures based on anchor chunks and the likely spatial locality of neighboring anchor chunks.

The present invention has been explained with reference to specific embodiments. Other embodiments will be evident to those of ordinary skill in the art. It is therefore not intended that the present invention be limited, except as indicated by the appended claims.

What is claimed is:

1. An apparatus comprising:
one or more network interfaces;
one or more processors;
a first memory operable to store a plurality of data units and a plurality of signature blocks, each data unit comprising a contiguous sequence of observed data chunks; each signature block corresponding to a data unit, and comprising a plurality of chunk signatures for respective data chunks in a corresponding data unit;
a second memory operable to store a plurality of chunk signatures, each chunk signature corresponding to an anchor data chunk, each chunk signature being associated with one or more signature blocks stored in the first memory, the second memory further comprising a signature block search space; and
logic encoded in one or more tangible media for execution and when executed operable to cause one or more processors to:
access a data block;
divide the data block into a plurality of data chunks;
compute chunk signatures for the plurality of data chunks;
identify a plurality of anchor chunks in the plurality of data chunks;
access the second memory to identify one or more matching chunk signatures;
read one or more signature blocks corresponding to the matching chunk signatures from the first memory into the signature block search space of the second memory; and
match one or more computed chunk signatures to chunk signatures of the one or more signature blocks in the signature block search space.

2. The apparatus of claim 1 wherein the logic is further operable to cause the one or more processors to construct a compressed data block based the computed chunk signatures that match respective chunk signatures in the signature block search space.

3. The apparatus of claim 1 wherein a data access rate of the second memory is greater than a data access rate of the first memory.

4. The apparatus of claim 1 wherein the first memory is a random access memory (RAM).

5. The apparatus of claim 1 wherein the second memory is a mass storage device.

6. The apparatus of claim 1 wherein the logic is further operable to:
replace data chunks with matching identified chunk signatures to create a compressed data block; and
transmit the compressed data block.

7. The apparatus of claim 1 wherein the logic is further operable to identify anchor chunks in the plurality of data chunks based on a threshold occurrence probability.

8. The apparatus of claim 1 wherein the logic is further operable to identify the plurality of anchor chunks in the data block based on a contiguous sequence of least significant bits in the data block.

9. The apparatus of claim 1 wherein the logic is further operable to cause the one or more processors to construct data units and corresponding signature blocks as data blocks are received.

10. A method comprising:
accessing a data block;
dividing the data block into a plurality of data chunks;
computing chunk signatures for the plurality of data chunks;
identifying a plurality of anchor chunks in the plurality of data chunks;
accessing a second memory to identify one or more matching chunk signatures;
reading one or more signature blocks corresponding to the matching chunk signatures from a first memory into the signature block search space of the second memory; and
matching one or more computed chunk signatures to chunk signatures of the one or more signature blocks in the signature block search space.

11. The method of claim 10 further comprising causing the one or more processors to construct a compressed data block based the computed chunk signatures that match respective chunk signatures in the signature block search space.

12. The method of claim 10 wherein a data access rate of the second memory is greater than a data access rate of the first memory.

13. The method of claim 10 wherein the first memory is a random access memory (RAM).

14. The method of claim 10 wherein the second memory is a mass storage device.

15. The method of claim 10 further comprising:
replacing data chunks with matching identified chunk signatures to create a compressed data block; and
transmitting the compressed data block.

16. The method of claim 10 further comprising identifying anchor chunks in the plurality of data chunks based on a threshold occurrence probability.

17. The method of claim 10 further comprising identifying the plurality of anchor chunks in the data block based on a contiguous sequence of least significant bits in the data block.

18. The method of claim 10 further comprising causing the one or more processors to construct data units and corresponding signature blocks as data blocks are received.

19. A method comprising:
accessing a compressed data block;
identifying raw data chunks and chunk signatures in the compressed data block;
computing chunk signatures for the raw data chunks;
identifying one or more anchor chunk signatures in the data block;
accessing a second memory to identify one or more anchor chunk signatures;
if an anchor chunk signature is identified in the second memory, adding one or more signature blocks corresponding to the identified anchor chunks to a search list; and
reading the signature blocks corresponding to the anchor chunk signatures in the search list into a first memory.

20. The method of claim 19 further comprising
searching the signature blocks, in the search list and read into the first memory, for chunk signatures that match the chunk signatures in the compressed data block; and
for each match, replacing the chunk signatures with a corresponding raw data chunk stored in a data unit.

21. Software encoded in one or more computer-readable media and when executed operable to:
access a data block;
divide the data block into a plurality of data chunks;
compute chunk signatures for the plurality of data chunks;
identify a plurality of anchor chunks in the plurality of data chunks;
access a second memory to identify one or more matching chunk signatures;
read one or more signature blocks corresponding to the matching chunk signatures from a first memory into the signature block search space of the second memory; and
match one or more computed chunk signatures to chunk signatures of the one or more signature blocks in the signature block search space.

22. The software of claim 21 wherein the software is further operable to construct a compressed data block based the computed chunk signatures that match respective chunk signatures in the signature block search space.

23. The software of claim 22 wherein a data access rate of the second memory is greater than a data access rate of the first memory.

24. The software of claim 22 wherein the first memory is a random access memory (RAM).

25. The software of claim 22 wherein the second memory is a mass storage device.

26. The software of claim 22 wherein the software is further operable to:
replace data chunks with matching identified chunk signatures to create a compressed data block; and
transmit the compressed data block.

27. The software of claim 22 wherein the software is further operable to identify anchor chunks in the plurality of data chunks based on a threshold occurrence probability.

28. The software of claim 22 wherein the software is further operable to identify the plurality of anchor chunks in the data block based on a contiguous sequence of least significant bits in the data block.

29. The software of claim 22 wherein the software is further operable to construct data units and corresponding signature blocks as data blocks are received.

30. An apparatus comprising:
means for storing a plurality of data units and a plurality of signature blocks, each data unit comprising a contiguous sequence of observed data chunks; each signature block corresponding to a data unit, and comprising a plurality of chunk signatures for respective data chunks in a corresponding data unit;
means for storing a plurality of chunk signatures, each chunk signature corresponding to an anchor data chunk, each chunk signature being associated with one or more signature blocks stored in the first memory, the second memory further comprising a signature block search space;
means for accessing a data block;

means for dividing the data block into a plurality of data chunks;

means for computing chunk signatures for the plurality of data chunks;

means for identifying a plurality of anchor chunks in the plurality of data chunks;

means for accessing the second memory to identify one or more matching chunk signatures;

means for reading one or more signature blocks corresponding to the matching chunk signatures from the first memory into the signature block search space of the second memory; and means for matching one or more computed chunk signatures to chunk signatures of the one or more signature blocks in the signature block search space.

* * * * *